US012712646B2

(12) United States Patent
Lillie et al.

(10) Patent No.: US 12,712,646 B2
(45) Date of Patent: Aug. 18, 2026

(54) LINK MONITORING AND INDICATION OF POTENTIAL LINK FAILURE

(71) Applicant: Altera Corporation, San Jose, CA (US)

(72) Inventors: Andrew K. Lillie, Chandler, AZ (US); Itamar Levin, Holon (IL); Amir Laufer, Petach Tikva (IL)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 17/689,757

(22) Filed: Mar. 8, 2022

(65) Prior Publication Data

US 2022/0200712 A1 Jun. 23, 2022

Related U.S. Application Data

(60) Provisional application No. 63/255,748, filed on Oct. 14, 2021.

(51) Int. Cl.

| | |
|---|---|
| ***H04B 17/309*** | (2015.01) |
| ***H04L 43/08*** | (2022.01) |
| ***H04W 24/08*** | (2009.01) |
| ***H04W 72/08*** | (2009.01) |
| ***H04W 72/542*** | (2023.01) |
| *H03L 7/06* | (2006.01) |

(52) U.S. Cl.
CPC ........... *H04B 17/309* (2015.01); *H04L 43/08* (2013.01); *H04W 24/08* (2013.01); *H04W 72/542* (2023.01); *H03L 7/06* (2013.01)

(58) Field of Classification Search
CPC .. H04B 17/309; H04W 72/542; H04W 24/08; H04L 43/08; H04L 7/06
See application file for complete search history.

(56) References Cited

U.S. PATENT DOCUMENTS

| | | | | |
|---|---|---|---|---|
| 8,817,643 | B1 * | 8/2014 | Sun | H04W 24/04 370/252 |
| 2002/0122503 | A1 * | 9/2002 | Agazzi | H04L 25/03159 375/316 |
| 2010/0046598 | A1 * | 2/2010 | Zhong | H04L 25/03057 375/233 |
| 2020/0249275 | A1 * | 8/2020 | Froelich | G06F 11/273 |

OTHER PUBLICATIONS

Campbell, Richard, "What Is Built-In Self Test And Why Do We Need It?", https://www.electronicdesign.com/home/article/21199861/what-is-builtin-self-test-and-why-do-we-need-it, Mar. 1996, 9 pages.
Gay, Michael J. and Pangier, Richard, "Making Sense of Laminate Dielectric Properties", Isola Group, 2011, 11 pages.
Hinaga, Scott et al., "Thermal Effects on PCB Laminate Material Dielectric Constant and Dissipation Factor", Jan. 2010, 9 pages.

* cited by examiner

*Primary Examiner* — Melvin C Marcelo
(74) *Attorney, Agent, or Firm* — Nicholson De Vos Webster & Elliott LLP

(57) ABSTRACT

Examples described herein relate to a physical layer interface (PHY) that includes circuitry configured to autonomously measure for signal degradation by a baseline measurement of parameters and one or more subsequent measurements of parameters to indicate if link loss is expected.

21 Claims, 10 Drawing Sheets

LINK MONITORING AND INDICATION OF POTENTIAL LINK FAILURE

RELATED APPLICATION

The present application claims the benefit of priority of U.S. Provisional application 63/255,748, filed Oct. 14, 2021. The contents of that application are incorporated herein in their entirety.

BACKGROUND

Packet transmission operations can take place from a network device (e.g., base station) to other devices using serial links. An interconnect or channel provides communications between two transceivers. A network of systems can include hundreds to thousands of links. A high-speed serial link between two devices in a communications system may be expected to operate for a decade or more and over a wide range of environmental conditions. Over time, the quality and reliability of the link can be jeopardized for a variety of reasons. Components in network devices, such as base stations, can be subject to environmental damage arising from moisture, vibrations, temperature variations, corrosion, or mechanical stress. Link degradation may occur due to silicon aging, channel aging, assembly or manufacturing defects, errors in hardware, firmware or software that introduce systematic cumulative errors, accidental damage, environmental damage, or even malicious activities.

DETAILED DESCRIPTION

To at least partially address degradation of signal propagation characteristics of a link and to avoid a surprise disruption of communication over a link, a physical layer interface (PHY) can periodically monitor selectable link parameters and compare them against baseline levels or thresholds and potentially log a warning or generate an interrupt to alert a management layer or administrator to take corrective action (e.g., link reset or re-routing of traffic around link) to avoid loss of ability to communicate using a link or improve signal propagation qualities of a link. The PHY can monitor serial links within a base station and from the base station to a data center to determine if link integrity is degrading. Measurement intervals can be programmable and can be shortened if degradation is detected. If unacceptable link degradation is detected, a link can be tested further and/or reset at a next available controlled maintenance opportunity. Additionally, traffic may be routed away from the problematic channel, prior to loss of link, based on the alert.

The PHY can measure a signal's eye opening properties to determine whether link degradation has occurred to a level to warrant issuing an alert. The PHY can indicate whether an eye height has changed from a baseline by shrinking beyond a programmed threshold amount. Alternatively, the PHY can determine whether one or more of the following has changed by a sufficient margin to issue an alert that a link has degraded: phase lock loop (PLL) lock range, or duty cycle correction.

To improve predictability of link performance and reliability, the PHY can perform automatic link monitoring of programmable characteristics based on programmable thresholds at programmable intervals. Results and logs could be stored in a memory device in a host or other system for data collection.

Figure 1:
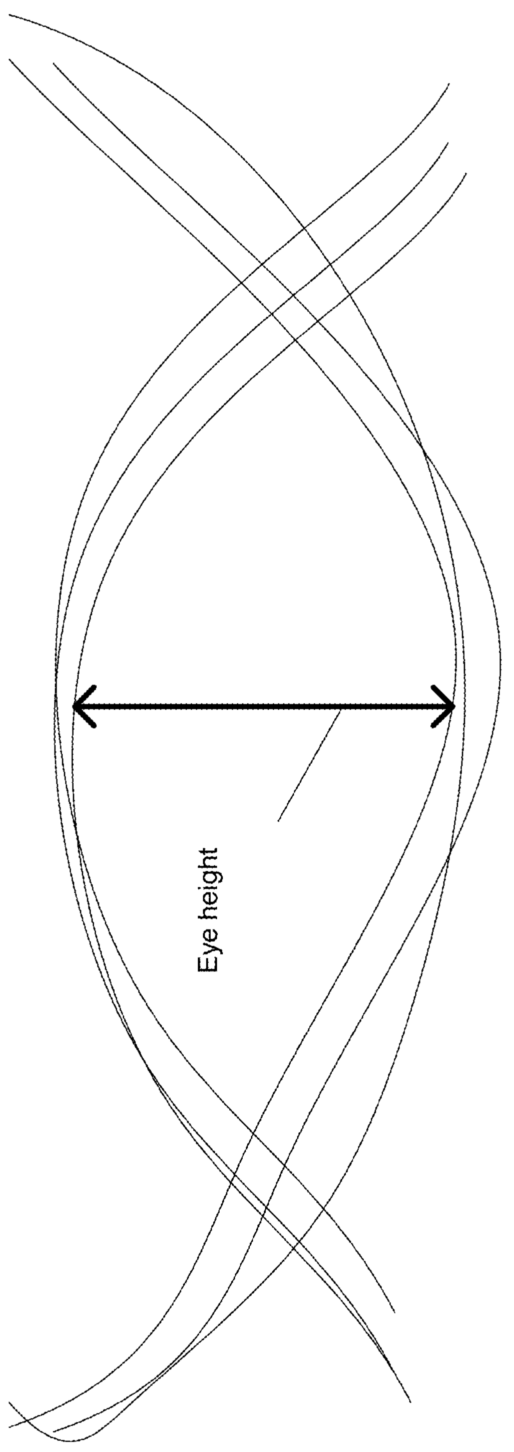
FIG. 1 depicts an example of an eye and eye height.

FIG. 1 depicts an example of an eye and eye height. An eye diagram can represent signal transitions from low to high and high to low measured over time. Eye height measurement can represent an inside height measurement from the lower inside edge to the upper inside edge. As data values are sampled from a signal, an open eye indicating a clear transition from low to high or high to low can indicate a lower likelihood of reading an erroneous value from a signal. Conversely, a smaller or less defined transition from low to high or high to low can indicate a higher likelihood of reading an erroneous value from a signal.

Figure 2:
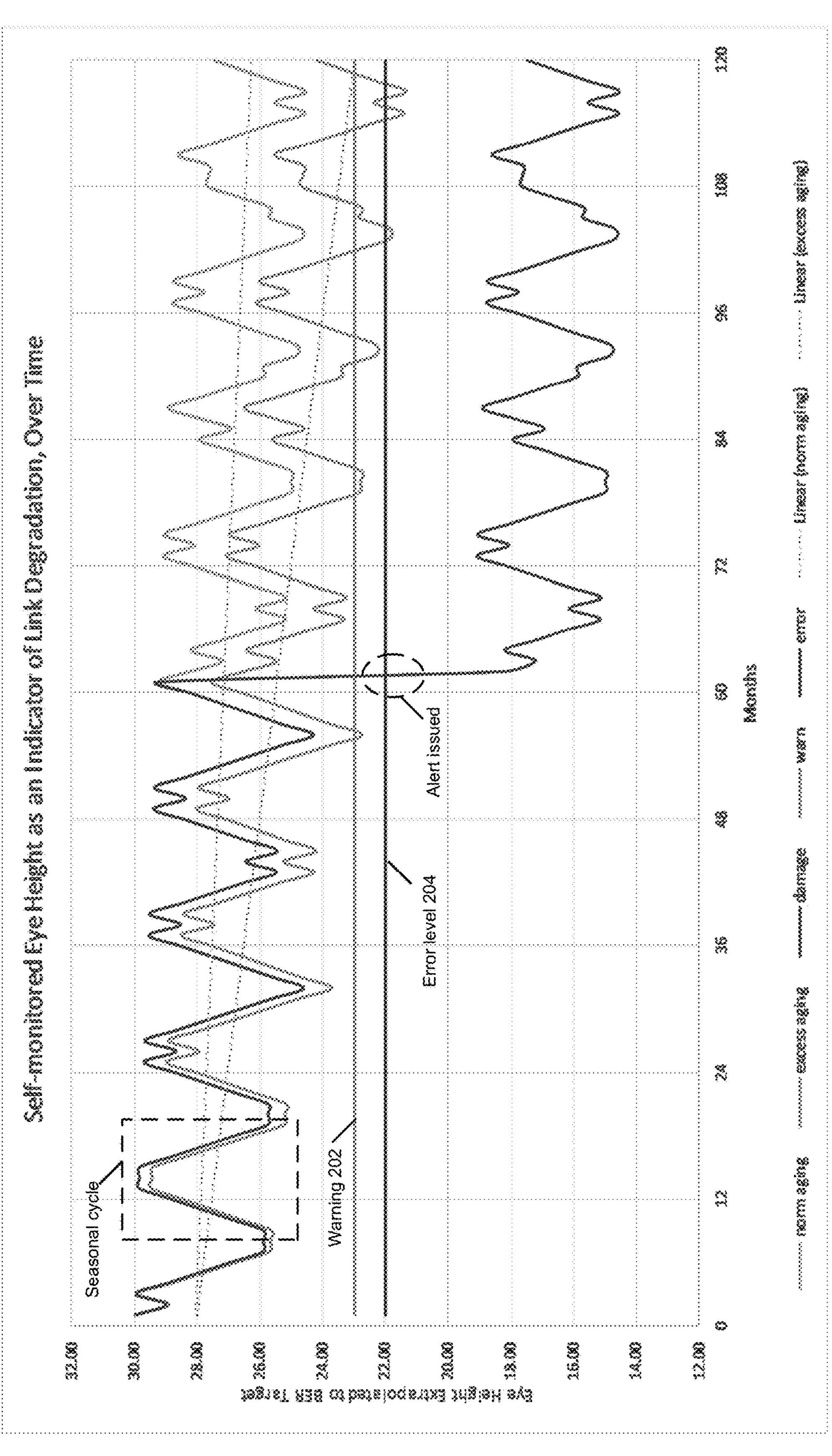
FIG. 2 depicts an example of measured eye height of a link deteriorates over time.

FIG. 2 depicts an example of measured eye height of a link deteriorates over time. A PHY can perform monitoring of link degradation based on warning level 202 and error event level 204. The levels may account for expected lifetime degradation. The PHY can be configured with levels to allow for expected seasonal variation for an outdoor extreme-environment application, for example. The y-axis can measure open eye height (e.g., mV). Eye height can be extrapolated and represented as a target Bit Error Ratio (BER). The x-axis can represent time (e.g., months).

In this example, at 60 months, an event damages a cable and the eye height/BER crosses error level 204, which triggers the PHY to issue an alert. The event can include a shutting of a cabinet door or maintenance cart running over a cable. The eye height at a receiver (RX) PHY can degrade significantly, and an alert generated. In some cases, the link may become un-operational after crossing below error level 204.

Figure 3:
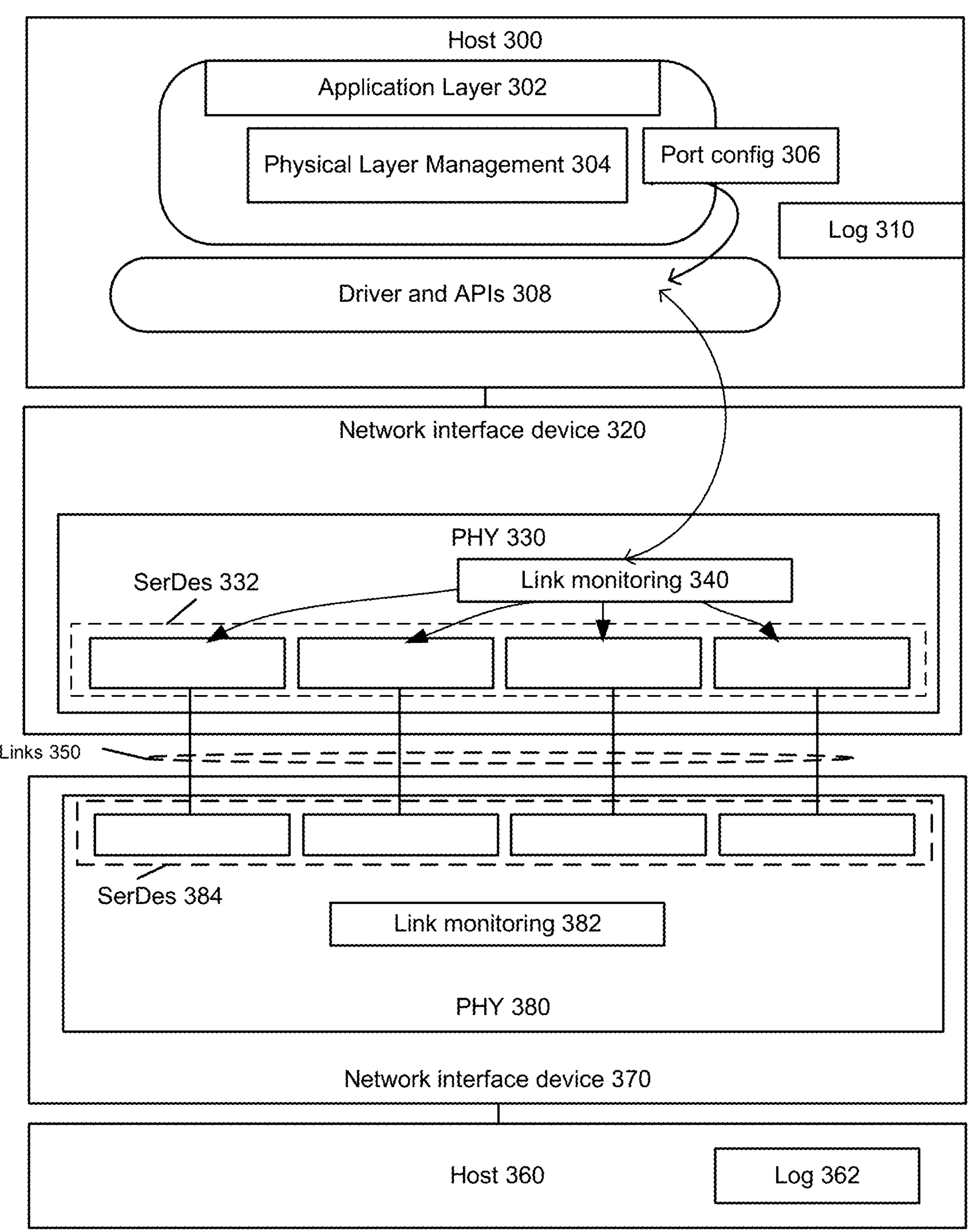
FIG. 3 depicts a system with link monitoring.

FIG. 3 depicts a system with link monitoring. Host 300 can utilize network interface device 320 to communicate with host 360 via network interface device 370 using links 350. Optical and/or electrical signal propagation media can provide communication for links 350. Various examples of host 300 and host 360 are described with respect to FIG. 10 whereas various examples of network interface device 320 and network interface device 370 are described with respect to FIG. 9. Examples described herein can be used in 5G base station or cellular communication networks.

Host 300 can execute port configuration software 306 using one or more processors. Port configuration software 306 can be provided by a communications equipment manufacturer to manage operation of serializer-deserializer (SerDes) 332 that communicate using one or more of links 350. Port configuration 306 can enable use of one or more ports and establish links 350 between network interface device 320 and network interface device 370. Port configuration 306 can manage use of ports and links through a stack of APIs and drivers 308 that control the link Media Access Controllers (MAC) (not shown in FIG. 3) and physical layer interface (PHY) 330.

After establishing links 350 using drivers and APIs 308, port configuration software 306 can configure operation of link monitoring circuitry 340 in PHY 330 of network interface device 330 to perform monitoring of one or more of links 350. Port configuration 306 can configure link monitoring circuitry 340 with parameter(s) to be measured, measurement interval, warning level, and error level. The measured parameters could include received eye height or another indication related to received signal quality or signal to noise ratio (SNR). Other measured parameters might include phase lock loop (PLL) lock range, duty cycle correction (e.g., transmit (TX) or receive (RX)), changes to phase alignment values, changes to equalizer coefficients, bias currents measured by an on-die analog-to-digital (A/D) converter, offset cancellation parameters, raw bit error rate (BER) error dependence statistics, counter values of corrected and uncorrected Forward Error Correction (FEC) values, and others depending on the PHY architecture and implementation. A change in one or more of the parameters can be caused by a change in a channel or SerDes and can impact link quality.

In some examples, link monitoring circuitry 340 can be implemented as a processor or microcontroller executed process, field programmable gate array (FPGA), application specific integrated circuit (ASIC), or other programmable hardware device. Link monitoring circuitry 340 can monitor an eye height of analog signals received by a SerDes among SerDes 332 from a transmission medium (e.g., electrical or optical cable) or digital conversion of signal. Link monitoring circuitry 340 can detect an error event where a link margin is degraded significantly by a deviation of an eye height from an initial or baseline eye height. If an error detected, link monitoring circuitry 340 can inform a driver and physical layer management and log the error to error log 310 in memory of host 300. If the eye height change exceeds a second, larger, threshold, link monitoring circuitry 340 can interrupt physical layer management 304. In some examples, link monitoring circuitry 340 can notify a data center administrator if the eye height change exceeds the second threshold. If the eye height change exceeds the second threshold, loss of communications via the link is likely to occur. Device removal, link replacement, and/or link re-establishment can be performed by an administrator.

Operation of link monitoring circuitry 340 can be started by physical layer management 304 (e.g., orchestrator or management software) executed by a processor of host 300 or another device after a link is established. Physical layer management 304 can cause content of log 310 can be cleared to free memory space for content of log 310. Log 310 can store baseline or initial monitoring measurements, the levels and intervals used to initiate monitoring, as well as measured parameters and associated time stamps. Measurement of baseline parameters or measurements can be taken during or after manufacture of a PHY in lab or testing facility or in the field while the PHY is utilized by a customer. Content of log 310 can be maintained even if the link is reset or re-established or its contents can be deleted. Warnings and error events and their time stamps can be overwritten after size or number of entries in log 310 reaches its limit.

If a link manager (e.g., physical layer management 304 and/or port configuration 306) receives an interrupt indicating an error level has been exceeded, or identifies warnings in excess of a threshold in a port's log during a polling or inspection window, link manager can manage the risk of that link degrading further or losing the link. Examples of risk management or corrective action might include resetting the link during an upcoming maintenance window, or during a period of low activity to shorten disruption of the link. Another risk management operation or corrective action could include a traffic manager re-routing traffic to a different link or a different system can be activated while the link can be reset. The system (e.g., system management and/or maintenance software) may generate a maintenance request to alert that link service is requested. Where temperature of a device exceeds a level and an error level has been exceeded, yet another risk management operation or corrective action could include managing temperature of PHY circuitry or network interface device by reducing temperature by reducing network traffic through the PHY circuitry or network interface device or increasing cooling of the PHY circuitry or network interface device. Where temperature of a device is below a second level and the error level has been exceeded, yet another risk management operation or corrective action could include increasing temperature PHY circuitry or network interface device by increasing a traffic load or utilizing heaters to increase temperature of the PHY circuitry or network interface device. Other corrective actions based on an error level having been exceeded can include utilizing forward error correction (FEC) to reduce the error level or adjusting transmitter and/or receiver equalizer setting to reduce the error level.

Flexibility and scalability of the process are provided by link monitoring 340 in PHY 330 autonomously monitoring link health. Layer link management software (e.g., physical layer management 304) can offload link monitoring to link monitoring 340 and can perform operations based on receipt of indications that an error level is passed. In other words, host 300 can free computing resources in host 300 for monitoring link health and offload link health monitoring to PHY 330. Moreover, operation of link monitoring 340 can be independent of a host and its executed system software. Layer link management software can query logs based on its maintenance and monitoring intervals. Link monitoring can be port mode agnostic and can be used for Ethernet (e.g., IEEE 802.3-2018), Common Public Radio Interface (CPRI) (e.g., CPRI Specification v7.0 (2015)), Peripheral Component Interconnect express (PCIe) (e.g., PCI-SIG PCI Express (2015)) or another serial input output (10) protocol.

The monitored or measured parameters can be applied for different media types. For example, media can be optical, electrical (e.g., backplane and cabled), or optical-electrical interfaces. Damage occurring to a direct-attached copper interface or an optical link could be detected by monitoring parameters.

Monitoring of parameters can identify damage to a media that occurred accidentally or intentionally and can include damaged cables, connectors, or active devices in the link such as re-timers or re-drivers. Monitoring can be of a SERDES and the channel and connectors and assembly too. In a small form-factor pluggable (SFP) transceiver module case, the monitoring can be is specific to the transceiver device. The SFP transceiver monitoring can be performed by polling parameters. Monitoring in form factors other than SFP can be performed such as SFP+ or Quad Small Form-factor Pluggable (QSFP).

A PHY designer can recommend a set of parameters for measurement and a set of levels to provide a specific sensitivity to channel and system changes and a rate of alerts. A SerDes customer can adjust the levels or measured parameters to achieve a different level of sensitivity of the monitoring system, causing more or less alerts based on the criticality of the link and resilience of the system.

Note that link monitoring can be utilized on one or both sides of a link. For example, PHY 380 can utilize link monitoring 380 that operates in a similar manner to link monitoring 340.

Figure 4:
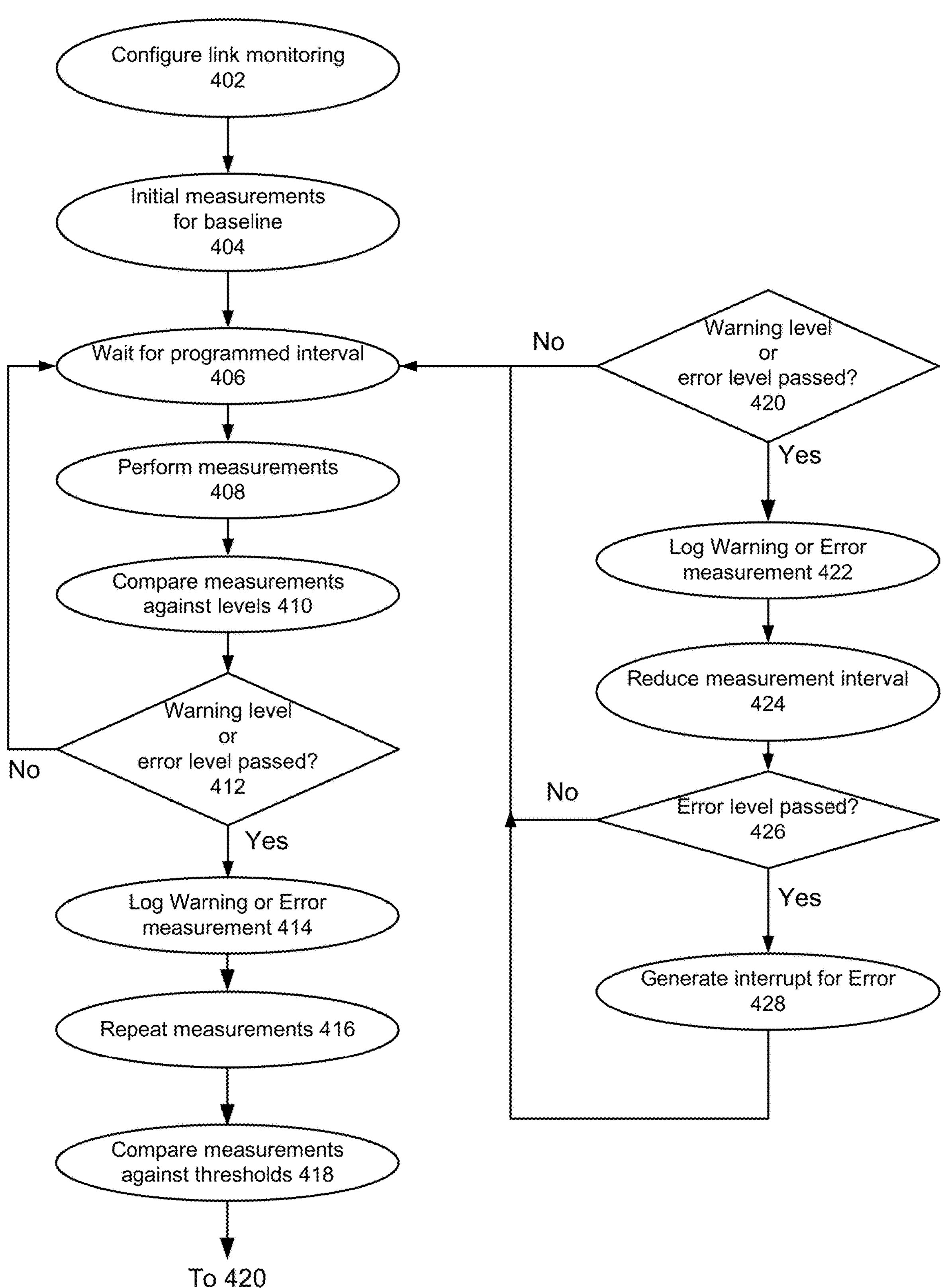
FIG. 4 depicts an example process.

FIG. 4 depicts an example process. The process can be performed by a PHY in some examples. The process can be performed after a link is established with a link partner on a port associated with a PHY SerDes for packet traffic operations. At 402, port configuration software can issue an application program interfaces (APIs) to initialize and enable link monitoring by the PHY on one or more port and associated links. Link monitoring parameters can be specified. Examples of link monitoring parameters can include one or more of the following: eye height, signal to noise ratio (SnR), duty cycle or phase correction, PLL tuning ranges, or combination thereof. Link monitoring parameters can include an initial measurement interval such as a time between measurement events conducted by the PHY on the port. Capacity to log events (e.g., available memory) and a number of ports managed by the PHY and other firmware tasks can dictate the interval, as well as information about the link type (e.g., external or internal link (whether media of link is exposed or not exposed to outside elements)), partner, and link health. A small measurement interval can be a shortest interval at which the measurements may be taken by the PHY. Specifying a small measurement interval that is less than the initial measurement interval can allow the PHY to make additional more frequent measurements if a link degradation is expected and the process needs to be more sensitive to impending link failure and determine whether to issue an alert of potential link failure sooner. For example, if an error is detected, checks of parameters can occur more frequently after detection of the error.

Link monitoring parameters can include a level to trigger a warning to be recorded in the log. This level may be an absolute value or a percentage change from the baseline or initial measurement and can differ from port to port. Levels can be determined during characterization of the system and may include hysteresis for improved robustness. Warnings or alerts may not trigger interrupts to an orchestrator or management software, but can be logged, and the higher layer can periodically poll the ports and check the logs to be aware of these events.

Link monitoring parameters can include a level to trigger an error to be recorded and to generate an interrupt to a higher layer. If a measurement triggers an error, the higher layer can take mitigation actions to recover the link or manage the risk. PHY firmware, circuitry, or processor-executed software can use this information while performing a process to determine whether to alert a higher layer software or administrator.

At 404, baseline or initial measurements for the configured measurements can be made and stored for comparison against configured levels for future measurements. Information including the parameters of the monitoring request along with a time stamp can be stored in a log.

At 406, after the programmed interval passes, at 408, measurements can be taken and recorded in a log autonomously by the PHY. At 410, latest measurements can be compared against the levels. At 412, if neither the warning or error level is exceeded, the process can return to 406.

At 412, if either the warning or error level is exceeded, at 414, the measurement value can be logged with its time stamp and the measurement is repeated at 416. At 416, other parameters may also be collected depending on the implementation and the measurement type. At 418, if a subsequent second measurement does not exceed either warning level or error level, the process can continue to 406 and wait the initial measurement interval before making another measurement.

At 418, the second measurement can be compared against the levels. At 420, if the second measurement still exceeds the warning level, at 422, the measurements and/or occurrence can be logged again with a time stamp. At 424, the measurement interval can be reduced (e.g., by half) until it reaches the programmed short interval and the process repeats measurements at 406 for that reduced interval. At 426, if the second measurement exceeds the error level, the occurrence is logged again with a time stamp, and, at 428, the process informs the higher layers of the error with an interrupt mechanism so that mitigation action can be taken as determined by the equipment manufacturer. The measurement interval can be reduced by half until it reaches the programmed short interval and the process repeats measurements at 406 for that reduced interval.

Link Degradation Based on Signal Reflection

A change in a dielectric constant Dk of a circuit board or signal propagation media can impact the propagation time of signals on a channel. Propagation time of a unit-length of channel can be represented by the following relationship:

$$tpd = \frac{\sqrt{D_k}}{c}$$

where Dk is the dielectric constant and c is the speed of light in vacuum (e.g., 3e8 m/sec). As the system changes temperature, a change of x % in Dk can translate to a change of $$\sqrt{1 + \frac{x}{100}}$$

in the channel delay, so, for example, a reflection at 150 UI delay (under 5% Dk change) can shift to 153 UIs. In other words, system temperature can impact propagation time of signals on a channel, which can in turn affect identification of a location of a reflection causing discontinuity.

Figure 5:
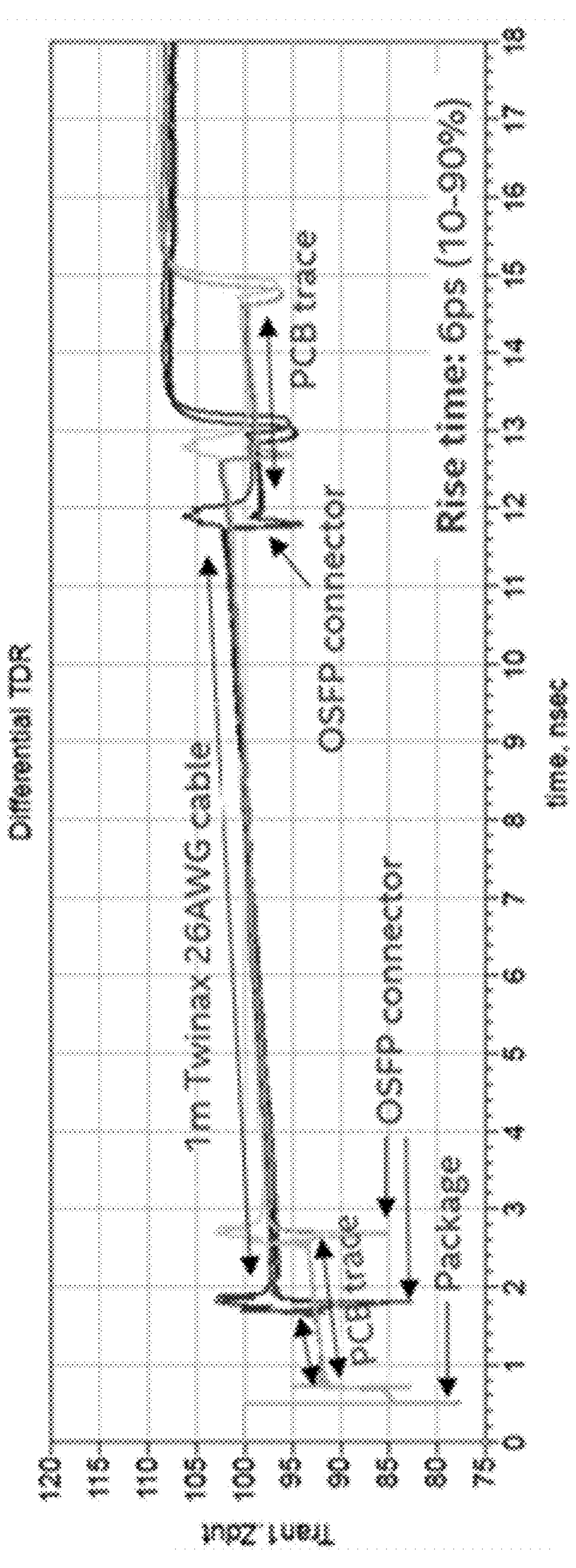
FIG. 5 depicts an example of warning and error levels.

FIG. 5 depicts an example of time-domain reflectometry (TDR) responses from connector reflections with different insertions. The TDR plot shows how the impedance of the channel is affected by reflections and the time delay or distance to a reflection. Reflections can be an effect of impedance discontinuity in the channel which causes some of the transmitted energy to reflect from the discontinuity and travel towards the transmitter. Reverberation of energy between several discontinuities may also occur, further degrading integrity of a transmitted signal. Impedance discontinuities include the effects of package balls, vias in the printed circuit board (PCB), or connector mechanical structure and other effect that changes the impedance of the channel.

Channel reflections can occur in the connector pins, which can be complex geometric structures with mechanical and electro-magnetic constraints. When a connector is inserted into a pin landing, and the connector is mated with a pin landing in a way that may result in an unreliable link with degraded channel arising from reflections. This might occur on a defective connector, a worn-out connector or even an improperly inserted connector, anywhere on the link.

When a channel degrades or a connector is misplaced, delay, insertion loss and matching changes, which can cause the reflection to change pattern and location. In a case of channel deterioration that effects the dielectric performance of the channel, reflections can shift location, which can result in increased bit error rate (BER) or a loss of link. As described earlier, temperature can impact signal reflection properties.

After many thermal and humidity cycles, the dielectric and loss coefficients of the channel can degrade, which can impact the delay and pattern of reflections. As described herein, a PHY can detect signal reflections as indicators of interconnect channel degradation. A PHY can detect and report changes in delay and pattern of reflections to the system operator so they can re-route data or recover the link in an orderly manner before it fails completely. The PHY can potentially detect a link degradation event early enough to alert management software or an administrator to take steps to avoid a failure before a loss of link, data and or connectivity. A PHY can alert a management software or a system operator based on detecting channel degradation or a connector was inserted poorly or mechanically damaged. The PHY can be used for 5G base stations where a loss of link such as this would result in dropped or lost cellular calls for any devices in that cell. At 112 and 224 Gbps/lane Ethernet communications, or other speeds, channel operating margins are low and the PHY can assist with providing long term reliable operation of links in high reliability applications.

Deterioration of a link or channel can cause changes in signal reflection properties of the channel. Reflections can include abrupt oscillations of the channel's pulse response caused by reverberation of energy at an impedance discontinuity. A discontinuity can result from changes of the material's dielectric constant. Discontinuities can cause signal propagation delays that can be detected by analysis of the channel by the serializer-deserializer (SerDes) receiver.

A SerDes can utilize feed forward equalizer (FFE) and decision feedback equalizer (DFE) taps placed at distributed locations on the channel pulse response to measure and manage reflections, which are among the inter symbol interference (ISI) components. A SerDes utilizing one or more Least Mean-Squares (LMS) equalizers for equalizer adaptation can detect channel degradation and provide information used to detect if a connector is mated in a way that may result in an unreliable link or link degradation from other causes. A PHY can utilize a SerDes receiver to monitor its equalizer for changes in its equalization solution and to analyze changes to identify channel reflections caused by impedance discontinuities compared to when the link is initialized or reset. Unexpected changes in the equalizer settings can trigger the PHY to alert a system management system and/or operator. A system operator can monitor a channel for deterioration based on the provided information. Channel initialization and degradation monitoring and the use of that information can be utilized in deciding link maintenance events such as link reset or use of another link.

Figure 6:
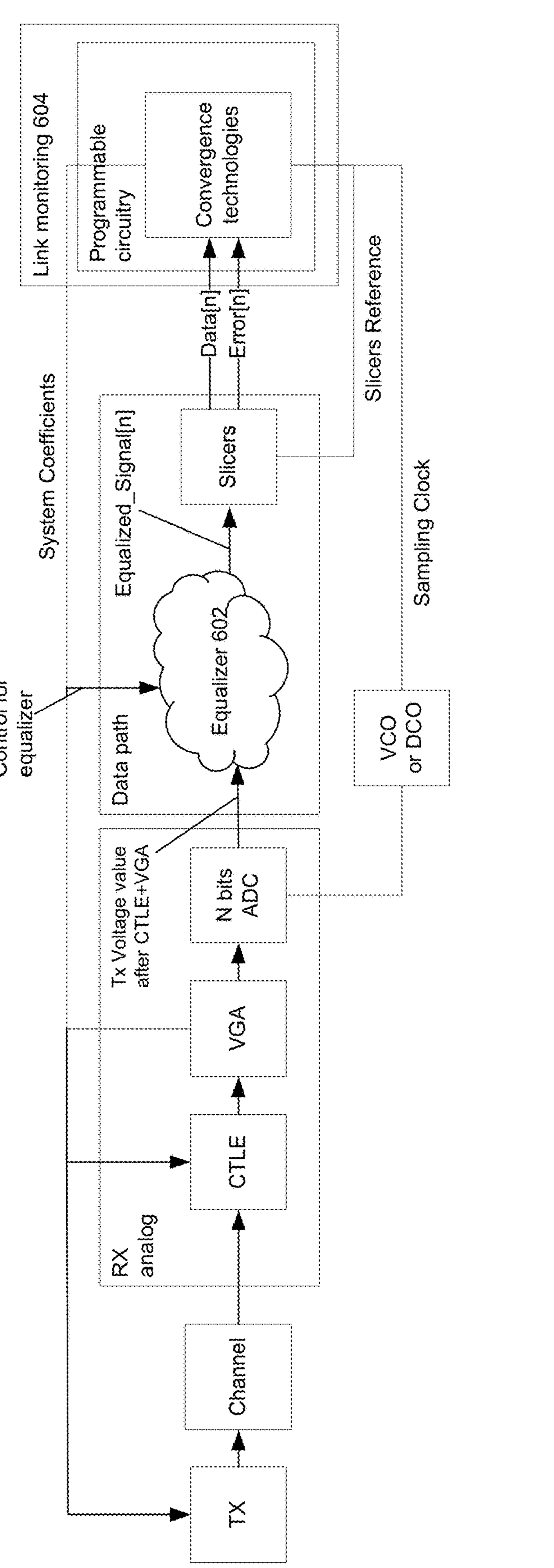
FIG. 6 depicts an example system.

FIG. 6 depicts an example of a SerDes. A signal received from a channel (e.g., signal propagation media) can be equalized and conditioned by continuous time linear equalizer (CTLE) and variable gain amplifier (VGA), sampled by an analog to digital converter (ADC) and further equalized using programmable circuitry. Decisions (e.g., Data[n]) can be made on the received bits using Slicers, and the error between the equalized signal and the decision can be calculated (e.g., Error[n]=Equalized Signal[n]−Data[n]).

Equalizer 602 can include equalizers such as FFE and/or DFE and its output can be used to determine ISI. Link monitoring 604 of a PHY can compute metrics of residual ISI (un-equalized ISI) and reflection related ISI after detecting the reflection on the pulse response (based on the scan described earlier). Link monitoring 604 of a PHY can perform ISI detection that operates non-destructively to a normal operation of the link since it used during mission-mode traffic. Link monitoring 604 can measure the channel ISI caused by insertion loss and reflections. Link monitoring 604 receives the receiver error signal and the detected data stream and determine whether changes in ISI tap values are indicative of deterioration of a link or channel or poor mating of a connection. For example, link monitoring 604 can calculate a projection of the $n^{th}$ tap ISI on the error signal by integrating Error[n] *Data[n−k] for the $n^{th}$ tap of ISI. For a sequence of measurements with n values, different taps of ISI can be measured, and a pulse response of the system can be mapped. The value of n can be negative or positive to estimate pre-cursor or post-cursor ISI taps. To determine a span of a reflection (n range), a threshold can be set and tap batches that exceed the threshold can be counted or identified as reflection ISI. Tap batches that do not exceed the threshold can be considered noise. In some examples, link monitoring circuitry 604 can be implemented as a processor or microcontroller executed process, field programmable gate array (FPGA), application specific integrated circuit (ASIC), or other programmable hardware device.

Figure 7:
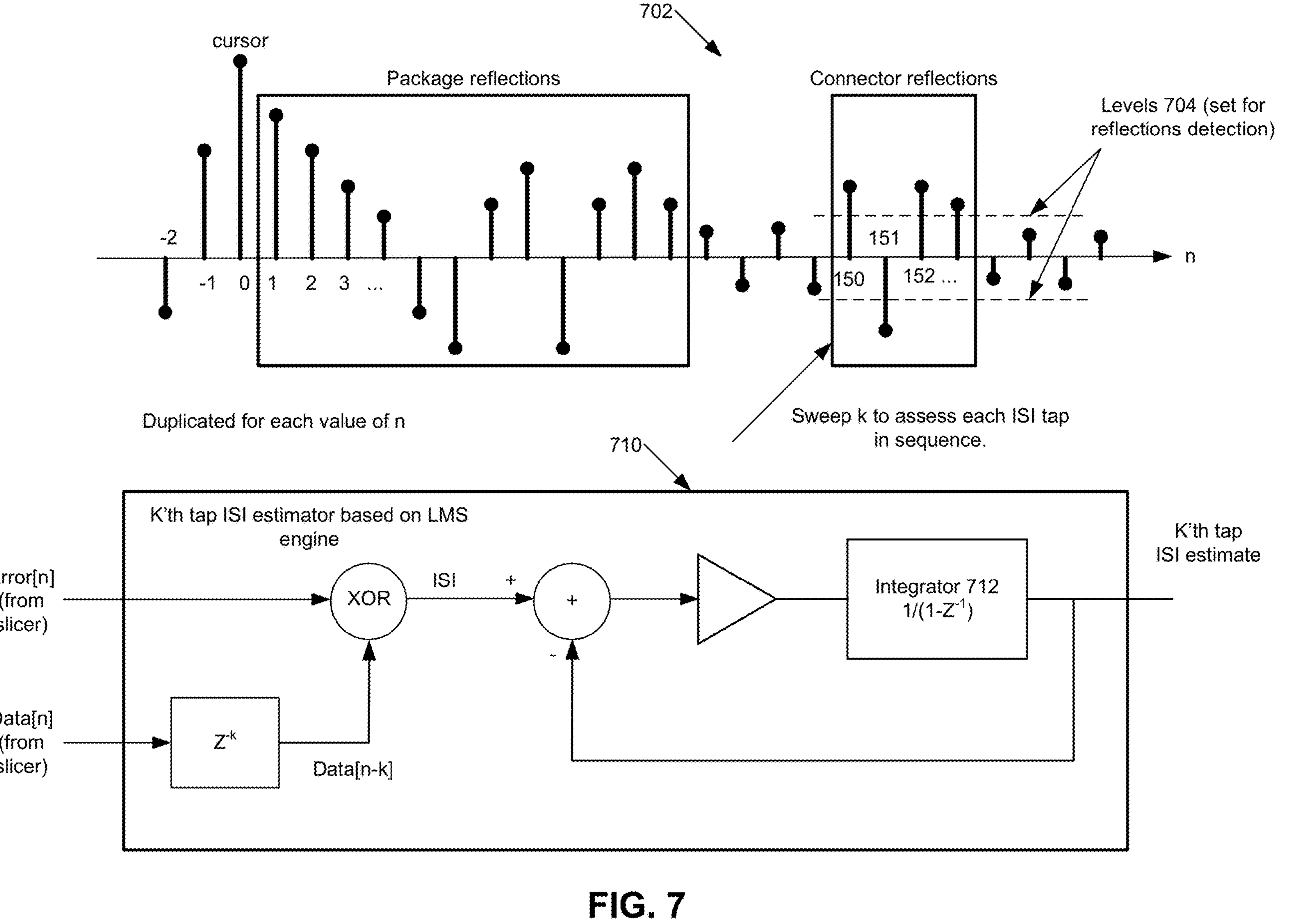
FIG. 7 depicts an example system.

FIG. 7 shows an example of sampled pulse responses of an example equalizer that performs ISI estimation. Sampled pulse responses are shown in diagram 702. In diagram 702, the y axis represents ISI values (e.g., in volts or energy) and the x axis represents pre-cursor bits (e.g., previously received bits associated with a positive index value n) and post-cursor bits (e.g., bits received after the cursor bit). A cursor can represent a current bit, with n=0. Reflections from pre-cursor bits and post-cursor bits can contribute to ISI. Index values from n=1 to 152 can represent ISI from previously received bits. ISI of signals divided can be divided into bins. For example, ISI from package reflections can be associated with a group of ISI values, whereas connector reflections can be associated with n=150 to 153. Connector reflections can be identified based on use of TDR as described herein. Connector locations and connection-to-package can be based on TDR analysis.

For one or more equalizer taps, ISI monitoring circuitry 710 can determine a baseline or initial measure of ISI for pre and post cursor bits. The baseline or initial measures of ISI for different n values can be stored in a log and used for comparison against subsequent measurements of ISI for the same n values. For example, level 704 can be set to identify reflection such as at least 10% or 15% increase from baseline or initial measurements for particular n values. In some examples, ISI monitoring circuitry 710 can monitor ISI of one or more individual taps, selected taps, or monitor an absolute sum of taps as a composite.

A PHY can utilize outputs from ISI monitoring circuitry 710 of a SerDes to track locations of reflection causing discontinuities using the LMS ISI detector during its operation, periodically. If locations shift over time in correlation with the board temperature, that shift can be related to thermal effects. However, a shift that persists after the thermal transient or independent of board temperature shift can be related to board aging and recorded in storage or a log. A combined impact of persistent and thermal variations in ISI and reflections can affect the channel margins. When channel margins cross a predefined threshold or level (e.g., level 704), actions can be taken to mitigate the degradation such as call for service to the platform or channel, routing of the data to alternative or redundant paths prior to link failure, or orderly and timed re-training of the SerDes equalizer settings to mitigate impact of the reflection ISI.

ISI monitoring circuitry 710 can receive an error[n] and data[n] from a slicer, apply delay element $Z^{-k}$ to the data[n], and XOR the output of error[n] and delayed data[n]. Integrator 712 can perform summation of ISI values for a particular n value or group of n values and if the summation increases beyond a threshold, link monitoring 604 can issue a warning or alert of potential link failure. Example metrics are to determine a sum of reflections by integrator 712 is as follows:

$$J_{Ref_{hamm}} = \sum_{k \in Reflections\ span} |h(k)|$$

$$J_{Ref_{rms}} = \left( \sum_{k \in Reflections\ span} h^2(k) \right)^{\frac{1}{2}}$$

$$J_{Ref_{max}} = \max_{k \in Reflections\ span} |h(k)|$$

where, k=n=bit ordinal h(k)=transformation bit ordinal k

For example, for a particular equalizer tap, ISI monitoring circuitry 710 can determine if absolute value of ISI changes after baseline or initial ISI value for an n value or range of n values. If the absolute value of ISI changes after baseline or initial ISI value for an n value or range of n values, link monitoring 604 of a PHY can issue a warning or alert of potential link failure.

When a channel is exposed to humidity, vibrations and temperature changes, its conductors erode, and the dielectric materials' properties change. Using on-platform thermal sensors data can be used to correlate change in dissipation factor and dielectric constant with temperature changes. A change in dissipation factor can change the attenuation of the channel routing, and change the magnitude of the reflections and ISI measured by the receiver. The change in ISI coefficients can indicate deterioration of the channel. The change can be detected by periodically comparing the current ISI coefficients to those captured when the link is initialized. The change can be either in coefficient magnitude or the position of a floating (variable position) tap which would require analysis of adjacent coefficients periodically.

Figure 8:
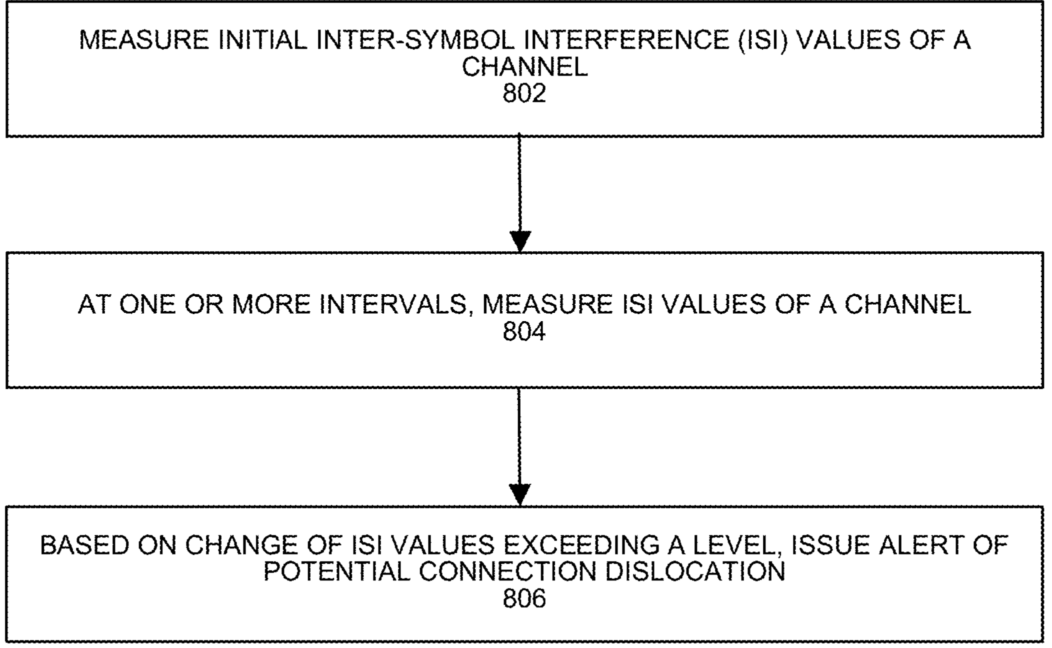
FIG. 8 depicts an example process.

FIG. 8 depicts an example process. Degradation of a link due to material failures, such as pinched cables, bumped connectors and twisted platform boards can be detected and reported. The process can be implemented in PHY to detect and alert the system operator of link degradation.

At 802, baseline or initial ISI measurements can be made and stored for reference. For example, baseline connector reflections can be stored in the SerDes micro-controller memory (or other system level storage). The measure of reflections can be an absolute sum of the reflection coefficients, the root mean square (RMS) of these coefficients, or the magnitude of the largest reflection, etc. During system installation, after technician assisted mating is performed, the connector's reflections can be measured, averaged, and stored in a memory device. The baseline or initial ISI measurements can be denoted REFLECTION_BASELINE.

At 804, at prescribed intervals, measurements of ISIs can be captured. For example, during SerDes operation, the ISI of a configured number of pre and post cursor ISI can be assessed. The metric REFLECTION_INSTANCE can represent captured measurements of ISIs at an interval of time.

At 806, based on a change in the measured ISIs from the baseline or initial ISI measurements exceeding a level, an alert indication can be issued to a link management software and/or administrator. For example, if REFLECTION_INSTANCE>REFLECTION_BASELINE+guard-band for an integer M number of repeated measurements, a possible connector dislocation event can be reported to a system operator. The guard-band used to filter events can be based on characterization of the channel at initialization and can correspond to the level. Different channels may have different associated guard-bands, and guard-bands can be proportional to the baseline.

Figure 9:
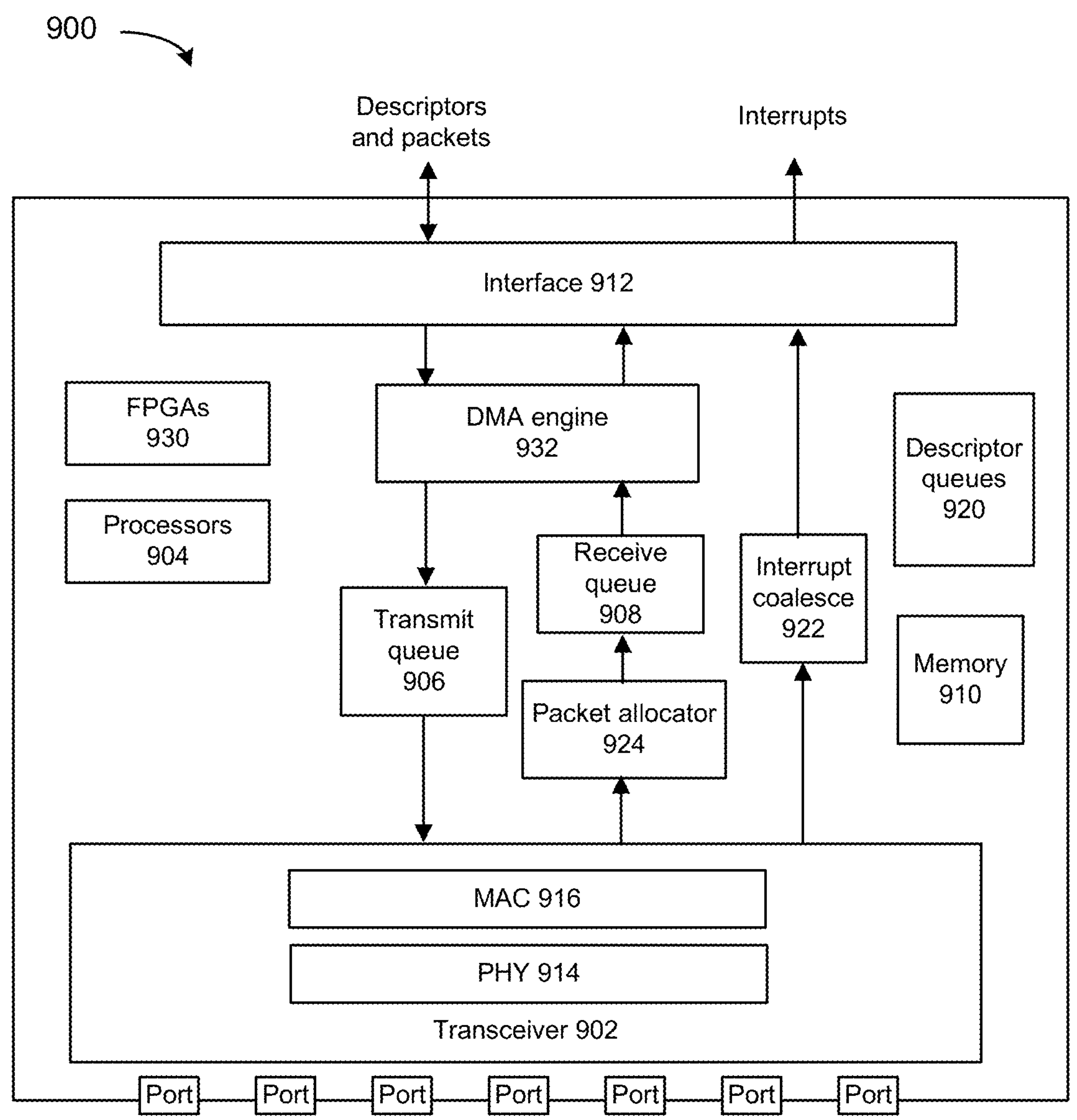
FIG. 9 depicts an example network interface device.

FIG. 9 depicts an example network interface device. Network interface 900 can connect with one or more signal propagation media to provide one or more links with a link partner. PHY 914 can be configured to monitor for changes in measured parameters and/or reflections that are indicative of potential channel or link failures and issue alerts of potential channel or link failures, as described herein. In some examples, network interface 900 can be implemented as a network interface controller, network interface card, a host fabric interface (HFI), or host bus adapter (HBA), and such examples can be interchangeable. Network interface 900 can be coupled to one or more servers using a bus, PCIe, CXL, or DDR. Network interface 900 may be embodied as part of a system-on-a-chip (SoC) that includes one or more processors, or included on a multichip package that also contains one or more processors.

Some examples of network device 900 are part of an Infrastructure Processing Unit (IPU) or data processing unit (DPU) or utilized by an IPU or DPU. An xPU can refer at least to an IPU, DPU, GPU, GPGPU, or other processing units (e.g., accelerator devices). An IPU or DPU can include a network interface with one or more programmable pipelines or fixed function processors to perform offload of operations that could have been performed by a CPU. The IPU or DPU can include one or more memory devices. In some examples, the IPU or DPU can perform virtual switch operations, manage storage transactions (e.g., compression, cryptography, virtualization), and manage operations performed on other IPUs, DPUs, servers, or devices.

Network interface 900 can include transceiver 902, processors 904, transmit queue 906, receive queue 908, memory 910, and bus interface 912, and DMA engine 932. Transceiver 902 can be capable of receiving and transmitting packets in conformance with the applicable protocols such as Ethernet as described in IEEE 802.3, although other protocols may be used. Transceiver 902 can receive and transmit packets from and to a network via a network medium (not depicted). Transceiver 902 can include PHY circuitry 914 and media access control (MAC) circuitry 916. PHY circuitry 914 can include encoding and decoding circuitry (not shown) to encode and decode data packets according to applicable physical layer specifications or standards. MAC circuitry 916 can be configured to perform MAC address filtering on received packets, process MAC headers of received packets by verifying data integrity, remove preambles and padding, and provide packet content for processing by higher layers. MAC circuitry 916 can be configured to assemble data to be transmitted into packets, that include destination and source addresses along with network control information and error detection hash values.

Processors 904 can be any a combination of: a processor, core, graphics processing unit (GPU), field programmable gate array (FPGA), application specific integrated circuit (ASIC), or other programmable hardware device that allow programming of network interface 900. For example, a "smart network interface" or SmartNIC can provide packet processing capabilities in the network interface using processors 904.

Processors 904 can include a programmable processing pipeline that is programmable by Programming Protocol-independent Packet Processors (P4), C, Python, Broadcom Network Programming Language (NPL), NVIDIA® CUDA®, NVIDIA® DOCA™, or x86 compatible executable binaries or other executable binaries. A programmable processing pipeline can include circuitry to perform match-action operations. Processors, FPGAs, other specialized processors, controllers, devices, and/or circuits can be used utilized for packet processing or packet modification. Ternary content-addressable memory (TCAM) can be used for parallel match-action or look-up operations on packet header content.

Packet allocator 924 can provide distribution of received packets for processing by multiple CPUs or cores using receive side scaling (RSS). When packet allocator 924 uses RSS, packet allocator 924 can calculate a hash or make another determination based on contents of a received packet to determine which CPU or core is to process a packet.

Interrupt coalesce 922 can perform interrupt moderation whereby network interface interrupt coalesce 922 waits for multiple packets to arrive, or for a time-out to expire, before generating an interrupt to host system to process received packet(s). Receive Segment Coalescing (RSC) can be performed by network interface 900 whereby portions of incoming packets are combined into segments of a packet. Network interface 900 provides this coalesced packet to an application.

Direct memory access (DMA) engine 932 can copy a packet header, packet payload, and/or descriptor directly from host memory to the network interface or vice versa, instead of copying the packet to an intermediate buffer at the host and then using another copy operation from the intermediate buffer to the destination buffer.

Memory 910 can be any type of volatile or non-volatile memory device and can store any queue or instructions used to program network interface 900. Transmit queue 906 can include data or references to data for transmission by network interface. Receive queue 908 can include data or references to data that was received by network interface from a network. Descriptor queues 920 can include descriptors that reference data or packets in transmit queue 906 or receive queue 908. Bus interface 912 can provide an interface with host device (not depicted). For example, bus interface 912 can be compatible with or based at least in part on PCI, PCI Express, PCI-x, Serial ATA, and/or USB (although other interconnection standards may be used), or proprietary variations thereof.

Figure 10:
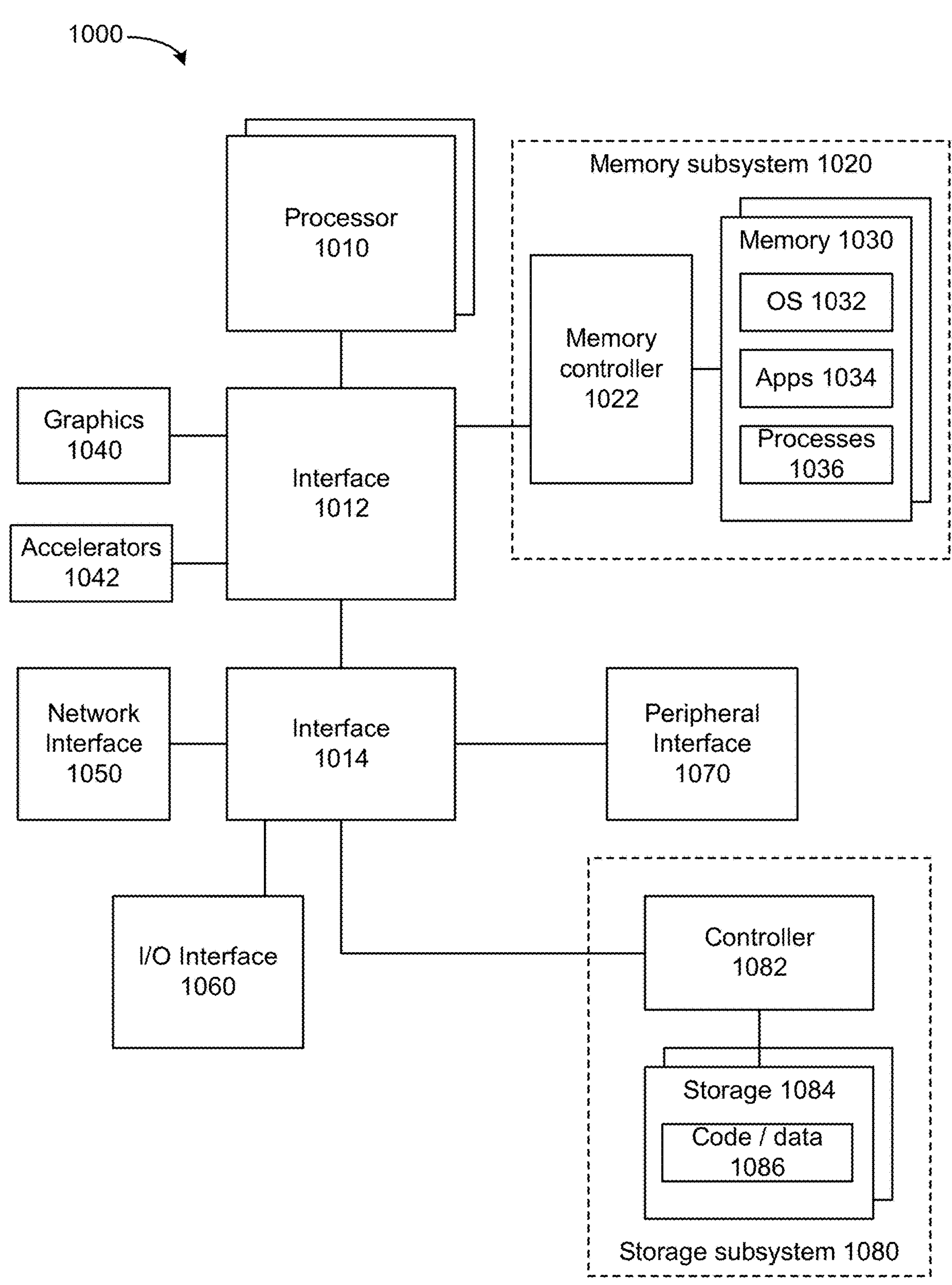
FIG. 10 depicts an example system.

FIG. 10 depicts an example computing system. Circuitry of network interface 1050 can be configured to monitor for changes in measured parameters and/or reflections that are indicative of potential channel or link failures and issue alerts of potential channel or link failures, as described herein. System 1000 includes processor 1010, which provides processing, operation management, and execution of instructions for system 1000. Processor 1010 can include any type of microprocessor, central processing unit (CPU), graphics processing unit (GPU), processing core, or other processing hardware to provide processing for system 1000, or a combination of processors. Processor 1010 controls the overall operation of system 1000, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 1000 includes interface 1012 coupled to processor 1010, which can represent a higher speed interface or a high throughput interface for system components that needs higher bandwidth connections, such as memory subsystem 1020 or graphics interface components 1040, or accelerators 1042. Interface 1012 represents an interface circuit, which can be a standalone component or integrated onto a processor die. Where present, graphics interface 1040 interfaces to graphics components for providing a visual display to a user of system 1000. In one example, graphics interface 1040 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 1040 generates a display based on data stored in memory 1030 or based on operations executed by processor 1010 or both. In one example, graphics interface 1040 generates a display based on data stored in memory 1030 or based on operations executed by processor 1010 or both.

Accelerators 1042 can be a fixed function or programmable offload engine that can be accessed or used by a processor 1010. For example, an accelerator among accelerators 1042 can provide compression (DC) capability, cryptography services such as public key encryption (PKE), cipher, hash/authentication capabilities, decryption, or other capabilities or services. In some embodiments, in addition or alternatively, an accelerator among accelerators 1042 provides field select controller capabilities as described herein. In some cases, accelerators 1042 can be integrated into a CPU socket (e.g., a connector to a motherboard or circuit board that includes a CPU and provides an electrical interface with the CPU). For example, accelerators 1042 can include a single or multi-core processor, graphics processing unit, logical execution unit single or multi-level cache, functional units usable to independently execute programs or threads, application specific integrated circuits (ASICs), neural network processors (NNPs), programmable control logic, and programmable processing elements such as field programmable gate arrays (FPGAs) or programmable logic devices (PLDs). Accelerators 1042 can provide multiple neural networks, CPUs, processor cores, general purpose graphics processing units, or graphics processing units can be made available for use by artificial intelligence (AI) or machine learning (ML) models. For example, the AI model can use or include one or more of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 1020 represents the main memory of system 1000 and provides storage for code to be executed by processor 1010, or data values to be used in executing a routine. Memory subsystem 1020 can include one or more memory devices 1030 such as read-only memory (ROM), flash memory, one or more varieties of random access memory (RAM) such as DRAM, or other memory devices, or a combination of such devices. Memory 1030 stores and hosts, among other things, operating system (OS) 1032 to provide a software platform for execution of instructions in system 1000. Additionally, applications 1034 can execute on the software platform of OS 1032 from memory 1030. Applications 1034 represent programs that have their own operational logic to perform execution of one or more functions. Processes 1036 represent agents or routines that provide auxiliary functions to OS 1032 or one or more applications 1034 or a combination. OS 1032, applications 1034, and processes 1036 provide software logic to provide functions for system 1000. In one example, memory subsystem 1020 includes memory controller 1022, which is a memory controller to generate and issue commands to memory 1030. It will be understood that memory controller 1022 could be a physical part of processor 1010 or a physical part of interface 1012. For example, memory controller 1022 can be an integrated memory controller, integrated onto a circuit with processor 1010.

In some examples, OS 1032 can be Linux®, Windows® Server or personal computer, FreeBSD®, Android®, MacOS®, iOS®, VMware vSphere, openSUSE, RHEL, CentOS, Debian, Ubuntu, or any other operating system. The OS and driver can execute on a CPU sold or designed by Intel®, ARM®, AMD®, Qualcomm®, Broadcom®, Nvidia®, IBM®, Texas Instruments®, among others.

In some examples, a driver can configure network interface 1050 to monitor for changes in measured parameters and/or reflections that are indicative of potential channel or link failures and issue alerts of potential channel or link failures, as described herein. A process 1036 can include link management software that can respond to an alert of potential channel or link failures to perform remedial actions such re-testing a link, resetting the link, routing traffic away from the problematic link, prior to loss of link.

While not specifically illustrated, it will be understood that system 1000 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a Hyper Transport or industry standard architecture (ISA) bus, a small computer system interface (SCSI) bus, a universal serial bus (USB), or an Institute of Electrical and Electronics Engineers (IEEE) standard 1394 bus (Firewire).

In one example, system 1000 includes interface 1014, which can be coupled to interface 1012. In one example, interface 1014 represents an interface circuit, which can include standalone components and integrated circuitry. In one example, multiple user interface components or peripheral components, or both, couple to interface 1014. Network interface 1050 provides system 1000 the ability to communicate with remote devices (e.g., servers or other computing devices) over one or more networks. Network interface 1050 can include an Ethernet adapter, wireless interconnection components, cellular network interconnection components, USB (universal serial bus), or other wired or wireless standards-based or proprietary interfaces. Network interface 1050 can transmit data to a device that is in the same data center or rack or a remote device, which can include sending data stored in memory. Network interface 1050 can execute a virtual switch to provide virtual machine-to-virtual machine communications for virtual machines (or other VEEs) in a same server or among different servers.

Some examples of network interface 1050 are part of an Infrastructure Processing Unit (IPU) or data processing unit (DPU) or utilized by an IPU or DPU. An xPU can refer at least to an IPU, DPU, GPU, GPGPU, or other processing units (e.g., accelerator devices). An IPU or DPU can include a network interface with one or more programmable pipelines or fixed function processors to perform offload of operations that could have been performed by a CPU. The IPU or DPU can include one or more memory devices. In some examples, the IPU or DPU can perform virtual switch operations, manage storage transactions (e.g., compression, cryptography, virtualization), and manage operations performed on other IPUs, DPUs, servers, or devices.

In one example, system 1000 includes one or more input/output (I/O) interface(s) 1060. I/O interface 1060 can include one or more interface components through which a user interacts with system 1000 (e.g., audio, alphanumeric, tactile/touch, or other interfacing). Peripheral interface 1070 can include any hardware interface not specifically mentioned above. Peripherals refer generally to devices that connect dependently to system 1000. A dependent connection is one where system 1000 provides the software platform or hardware platform or both on which operation executes, and with which a user interacts.

In one example, system 1000 includes storage subsystem 1080 to store data in a nonvolatile manner. In one example, in certain system implementations, at least certain components of storage 1080 can overlap with components of memory subsystem 1020. Storage subsystem 1080 includes storage device(s) 1084, which can be or include any conventional medium for storing large amounts of data in a nonvolatile manner, such as one or more magnetic, solid state, or optical based disks, or a combination. Storage 1084 holds code or instructions and data 1086 in a persistent state (e.g., the value is retained despite interruption of power to system 1000). Storage 1084 can be generically considered to be a "memory," although memory 1030 is typically the executing or operating memory to provide instructions to processor 1010. Whereas storage 1084 is nonvolatile, memory 1030 can include volatile memory (e.g., the value or state of the data is indeterminate if power is interrupted to system 1000). In one example, storage subsystem 1080 includes controller 1082 to interface with storage 1084. In one example controller 1082 is a physical part of interface 1014 or processor 1010 or can include circuits or logic in both processor 1010 and interface 1014.

A volatile memory is memory whose state (and therefore the data stored in it) is indeterminate if power is interrupted to the device. Dynamic volatile memory uses refreshing the data stored in the device to maintain state. One example of dynamic volatile memory incudes DRAM (Dynamic Random Access Memory), or some variant such as Synchronous DRAM (SDRAM). An example of a volatile memory include a cache. A memory subsystem as described herein may be compatible with a number of memory technologies.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), Intel® Optane™ memory, or NVM devices that use chalcogenide phase change material (for example, chalcogenide glass).

A power source (not depicted) provides power to the components of system 1000. More specifically, power source typically interfaces to one or multiple power supplies in system 1000 to provide power to the components of system 1000. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 1000 can be implemented using interconnected compute sleds of processors, memories, storages, network interfaces, and other components. High speed interconnects can be used such as: Ethernet (IEEE 802.3), remote direct memory access (RDMA), InfiniBand, Internet Wide Area RDMA Protocol (iWARP), Transmission Control Protocol (TCP), User Datagram Protocol (UDP), quick UDP Internet Connections (QUIC), RDMA over Converged Ethernet (RoCE), Peripheral Component Interconnect express (PCIe), Intel QuickPath Interconnect (QPI), Intel Ultra Path Interconnect (UPI), Intel On-Chip System Fabric (IOSF), Omni-Path, Compute Express Link (CXL), HyperTransport, high-speed fabric, NVLink, Advanced Microcontroller Bus Architecture (AMBA) interconnect, OpenCAPI, Gen-Z, Infinity Fabric (IF), Cache Coherent Interconnect for Accelerators (CCIX), 3GPP Long Term Evolution (LTE) (4G), 3GPP 5G, and variations thereof. Data can be copied or stored to virtualized storage nodes or accessed using a protocol such as NVMe over Fabrics (NVMe-oF) or NVMe.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

In some examples, network interface and other embodiments described herein can be used in connection with a base station (e.g., 3G, 4G, 5G and so forth), macro base station (e.g., 5G networks), picostation (e.g., an IEEE 802.11 compatible access point), nanostation (e.g., for Point-to-MultiPoint (PtMP) applications), on-premises data centers, off-premises data centers, edge network elements, fog network elements, and/or hybrid data centers (e.g., data center that use virtualization, cloud and software-defined networking to deliver application workloads across physical data centers and distributed multi-cloud environments).

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. A processor can be one or more combination of a hardware state machine, digital control logic, central processing unit, or any hardware, firmware and/or software elements.

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of operations may also be performed according to alternative embodiments. Furthermore, additional operations may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

Illustrative examples of the devices, systems, and methods disclosed herein are provided below. An embodiment of the devices, systems, and methods may include any one or more, and any combination of, the examples described below.

Example 1 includes one or more examples, and includes an apparatus comprising: a physical layer interface (PHY) comprising circuitry configured to autonomously measure for signal degradation and to indicate if link loss is expected based on a baseline measurement of parameters and one or more subsequent measurements of parameters.

Example 2 includes one or more examples, wherein the parameters comprise one or more of: eye height, signal to noise ratio (SNR), phase lock loop (PLL) lock range, phase alignment values, equalizer coefficients, bias currents measured by an on-die analog-to-digital (A/D) converter, offset cancellation parameters, raw bit error rate (BER) error dependence statistics, and/or counter values of corrected and uncorrected Forward Error Correction (FEC) values.

Example 3 includes one or more examples, wherein the circuitry is configured to adjust an interval of parameter measurements based on the comparison indicating link loss being expected.

Example 4 includes one or more examples, wherein the circuitry is coupled to serializer-deserializer (SerDes) device.

Example 5 includes one or more examples, wherein the SerDes device is to provide inter symbol interference (ISI) data and the circuitry is to indicate a potential connector dislocation based on changes to ISI data.

Example 6 includes one or more examples, wherein the circuitry is to indicate a potential connector dislocation based on changes to ISI data is to: store a baseline ISI data for connector reflections; measure ISI data for connector reflections; and indicate a potential connector dislocation based on measured ISI data and baseline ISI data.

Example 7 includes one or more examples, wherein ISI data for connector reflections is based on one or more particular connections identified based on time-domain reflectometry (TDR).

Example 8 includes one or more examples, and includes a network interface device comprising the PHY, wherein the network interface device comprises: one or more ports coupled to the PHY; circuitry to perform media access control (MAC) operations; and packet processing circuitry coupled to the circuitry to perform MAC operations.

Example 9 includes one or more examples, and includes a host system communicatively coupled to the PHY, wherein the host system is to receive the indication if link loss is expected and perform one or more remedial actions.

Example 10 includes one or more examples, and includes a non-transitory computer-readable medium comprising instructions stored thereon, that if executed by one or more processors, cause the one or more processors to: configure circuitry configured to autonomously measure for signal degradation and to indicate if link loss is expected based on a baseline measurement of parameters and one or more subsequent measurements of parameters.

Example 11 includes one or more examples, wherein the parameters comprise one or more of: eye height, signal to noise ratio (SNR), phase lock loop (PLL) lock range, phase alignment values, equalizer coefficients, bias currents measured by an on-die analog-to-digital (A/D) converter, offset cancellation parameters, raw bit error rate (BER) error dependence statistics, and/or counter values of corrected and uncorrected Forward Error Correction (FEC) values.

Example 12 includes one or more examples, and includes instructions stored thereon, that if executed by one or more processors, cause the one or more processors to: configure the circuitry to adjust an interval of parameter measurements based on the link loss being expected.

Example 13 includes one or more examples, and includes instructions stored thereon, that if executed by one or more processors, cause the one or more processors to: configure the circuitry to receive inter symbol interference (ISI) data and to indicate a potential connector dislocation based on changes to the ISI data.

Example 14 includes one or more examples, wherein to indicate a potential connector dislocation based on changes to the ISI data, the circuitry is configured to: store a baseline ISI data for connector reflections; measure ISI data for connector reflections; and indicate a potential connector dislocation based on measured ISI data and baseline ISI data.

Example 15 includes one or more examples, and includes a method comprising: autonomously measuring, by circuitry of a physical layer interface (PHY), for signal degradation by measurement of baseline parameters and indicating, by the circuitry of the PHY, if link loss is expected based on the baseline parameters and one or more subsequent measurements of parameters.

Example 16 includes one or more examples, wherein the parameters comprise one or more of: eye height, signal to noise ratio (SNR), phase lock loop (PLL) lock range, phase alignment values, equalizer coefficients, bias currents measured by an on-die analog-to-digital (A/D) converter, offset cancellation parameters, raw bit error rate (BER) error dependence statistics, and/or counter values of corrected and uncorrected Forward Error Correction (FEC) values.

Example 17 includes one or more examples, wherein the parameters comprise inter symbol interference (ISI) data.

Example 18 includes one or more examples, and includes adjusting an interval of parameter measurements based on the link loss being expected.

Example 19 includes one or more examples, and includes indicating a potential connector dislocation based on changes to inter symbol interference (ISI) data.

Example 20 includes one or more examples, wherein indicating a potential connector dislocation based on changes to inter symbol interference (ISI) data comprises: storing a baseline ISI data for connector reflections; measuring ISI data for connector reflections; and indicating a potential connector dislocation based on measured ISI data and baseline ISI data.

What is claimed is:

1. An apparatus comprising:

one or more slicers to provide data and error; and a physical layer interface (PHY) comprising:

a serializer-deserializer (SerDes) device comprising a plurality of decision feedback equalizer (DFE) taps, and circuitry, coupled to the SerDes device, configured to autonomously measure for signal degradation and to indicate if link loss is expected to occur based on a baseline measurement of parameters and one or more subsequent measurements of parameters, wherein:

the parameters comprise inter symbol interference (ISI) values measured from one or more of the plurality of DFE taps, the circuitry comprises an integrator to sum the ISI values for one or more of the plurality of DFE taps, and the link loss is expected to occur based on the sum of the ISI data values for the one or more of the plurality of DFE taps.

2. The apparatus of claim 1, wherein the parameters comprise one or more of: eye height, signal to noise ratio (SNR), phase lock loop (PLL) lock range, phase alignment values, equalizer coefficients, bias currents measured by an on-die analog-to-digital (A/D) converter, offset cancellation parameters raw bit error rate (BER) error dependence statistics, and/or counter values of corrected and uncorrected Forward Error Correction (FEC) values.

3. The apparatus of claim 1, wherein the circuitry is configured to adjust an interval of parameter measurements based on link loss being expected.

4. The apparatus of claim 1, wherein the circuitry is to indicate a potential connector dislocation based on changes to ISI data.

5. The apparatus of claim 4, wherein to indicate a potential connector dislocation based on changes to ISI data, the circuitry is to:

store a baseline ISI data for connector reflections;

measure ISI data for connector reflections; and indicate a potential connector dislocation based on measured ISI data and baseline ISI data.

6. The apparatus of claim 5, wherein ISI data for connector reflections is based on one or more particular connections identified based on time-domain reflectometry (TDR).

7. The apparatus of claim 1, comprising:

a network interface device comprising the PHY, wherein the network interface device comprises:

one or more ports coupled to the PHY;

circuitry to perform media access control (MAC) operations; and packet processing circuitry coupled to the circuitry to perform MAC operations.

8. The apparatus of claim 1, comprising:

a host system communicatively coupled to the PHY, wherein the host system is to receive the indication if link loss is expected and perform one or more remedial actions.

9. At least one non-transitory computer-readable medium comprising instructions stored thereon, that if executed by one or more processors cause the one or more processors to:

configure circuitry to autonomously measure for signal degradation at a physical layer interface (PHY) and to indicate if link loss is expected to occur based on a baseline measurement of parameters and one or more subsequent measurements of parameters wherein the parameters comprise inter symbol interference (ISI) values measured from one or more of a plurality of decision feedback equalizer (DFE) taps of a serializer-deserializer (SerDes) device of the PHY, the circuitry comprises an integrator to sum the ISI values for one or more of the plurality of DFE taps, and the link loss is expected to occur based on the sum of the ISI values for the one or more of the plurality of DFE taps.

10. The computer-readable medium of claim 9, wherein the parameters comprise one or more of: eye height, signal to noise ratio (SNR), phase lock loop (PLL) lock range, phase alignment values, equalizer coefficients, bias currents measured by an on-die analog-to-digital (A/D) converter, offset cancellation parameters, raw bit error rate (BER) error dependence statistics, and/or counter values of corrected and uncorrected Forward Error Correction (FEC) values.

11. The computer-readable medium of claim 9, comprising instructions stored thereon, that if executed by one or more processors, cause the one or more processors to:

configure the circuitry to adjust an interval of parameter measurements based on the link loss being expected.

12. The computer-readable medium of claim 9, wherein to indicate a potential connector dislocation based on changes to the ISI data, the circuitry is configured to:

store a baseline ISI data for connector reflections;

measure ISI data for connector reflections; and indicate a potential connector dislocation based on measured ISI data and baseline ISI data.

13. A method comprising:

autonomously measuring, by circuitry of a physical layer interface (PHY), for signal degradation by measurement of baseline parameters and indicating, by the circuitry of the PHY, if link loss is expected to occur based on the baseline parameters and one or more subsequent measurements of parameters, wherein the parameters comprise inter symbol interference (ISI) values measured from one or more of a plurality of decision feedback equalizer (DFE) taps of a serializer-deserializer (SerDes) device of the PHY, the circuitry comprises an integrator to sum the ISI values for one or more of the plurality of DFE taps, and the link loss is expected to occur based on the sum of the ISI values for the one or more of the plurality of DFE taps.

14. The method of claim 13, wherein the parameters comprise one or more of: eye height, signal to noise ratio (SNR), phase lock loop (PLL) lock range, phase alignment values, equalizer coefficients, bias currents measured by an on-die analog-to-digital (A/D) converter, offset cancellation parameters, raw bit error rate (BER) error dependence statistics, and/or counter values of corrected and uncorrected Forward Error Correction (FEC) values.

15. The method of claim 13, comprising:

adjusting an interval of parameter measurements based on link loss being expected.

16. The method of claim 13, comprising:

indicating a potential connector dislocation based on changes to ISI data.

17. The method of claim 16, wherein indicating a potential connector dislocation based on changes to ISI data comprises:

storing a baseline ISI data for connector reflections;

measuring ISI data for connector reflections; and indicating a potential connector dislocation based on measured ISI data and baseline ISI data.

18. A system comprising:

a first host system comprising a processor and a memory;

a transmitter, coupled to the first host system;

a second host system comprising a processor and a memory; and a receiver, coupled to the second host system, wherein:

the transmitter is to transmit a signal to the receiver, the receiver comprises:

one or more slicers to provide data and error based on the signal received by the receiver, and a physical layer interface (PHY) comprising:

a serializer-deserializer (SerDes) device comprising a plurality of decision feedback equalizer (DFE) taps, and circuitry, coupled to the SerDes device, configured to autonomously measure for signal degradation and to indicate if link loss is expected to occur based on a baseline measurement of parameters and one or more subsequent measurements of parameters, wherein:

the parameters comprise inter symbol interference (ISI) values measured from one or more of the plurality of DFE taps, the circuitry comprises an integrator to sum the ISI values for one or more of the plurality of DFE taps, and the link loss is expected to occur based on the sum of the ISI values for the one or more of the plurality of DFE taps.

19. The system of claim 18, wherein:

the first host system is to provide data to the transmitter for transmission in the signal to the receiver and the receiver is to provide the data from the one or more slicers to the second host system.

20. The system of claim 18, wherein the parameters comprise one or more of: eye height, signal to noise ratio (SNR), phase lock loop (PLL) lock range, phase alignment values, equalizer coefficients, bias currents measured by an on-die analog-to-digital (A/D) converter, offset cancellation parameters, raw bit error rate (BER) error dependence statistics, and/or counter values of corrected and uncorrected Forward Error Correction (FEC) values.

21. The system of claim 18, wherein the circuitry is to indicate a potential connector dislocation based on changes to ISI data.

* * * * *